(12) United States Patent
Tamaki

(10) Patent No.: US 12,142,718 B2
(45) Date of Patent: Nov. 12, 2024

(54) LIGHT EMITTER MOUNTING BOARD AND DISPLAY DEVICE INCLUDING LIGHT EMITTER MOUNTING BOARD

(71) Applicant: KYOCERA Corporation, Kyoto (JP)

(72) Inventor: Masaya Tamaki, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 558 days.

(21) Appl. No.: 17/611,326

(22) PCT Filed: Apr. 20, 2020

(86) PCT No.: PCT/JP2020/017108
§ 371 (c)(1),
(2) Date: Nov. 15, 2021

(87) PCT Pub. No.: WO2020/241117
PCT Pub. Date: Dec. 3, 2020

(65) Prior Publication Data
US 2022/0209085 A1    Jun. 30, 2022

(30) Foreign Application Priority Data
May 29, 2019 (JP) .................. 2019-100381

(51) Int. Cl.
*H01L 33/00* (2010.01)
*H01L 25/075* (2006.01)
(Continued)

(52) U.S. Cl.
CPC .......... *H01L 33/62* (2013.01); *H01L 25/0753* (2013.01); *H01L 33/56* (2013.01);
(Continued)

(58) Field of Classification Search
CPC ..... H01L 33/62; H01L 25/0753; H01L 33/56; H01L 33/58; H01L 33/60;
(Continued)

(56) References Cited

U.S. PATENT DOCUMENTS 8,807,771 B2 *  8/2014  Takeuchi ................ F21V 13/04
                                                    362/97.1

FOREIGN PATENT DOCUMENTS

JP    2016-522585 A    7/2016
WO   2014/204695 A1   12/2014

* cited by examiner

*Primary Examiner* — Tan N Tran
(74) *Attorney, Agent, or Firm* — Procopio, Cory, Hargreaves & Savitch LLP

(57) ABSTRACT

A light emitter mounting board for improving light extraction efficiency includes an insulating substrate, an electrode layer, a resin layer, a coating layer, and a reflective electrode. The resin layer is located on the electrode layer and has a through-hole portion extending in a thickness direction. The coating layer covers a surface of the resin layer and an inner peripheral surface of the through-hole portion. The coating layer includes an in-hole portion covering the inner peripheral surface and having a lateral thickness gradually increasing from the surface of the resin layer toward the electrode layer. The reflective electrode extends at least on a surface of the in-hole portion of the coating layer and on an exposed portion of a surface of the electrode layer.

8 Claims, 6 Drawing Sheets

(51) Int. Cl.
*H01L 33/56* (2010.01)
*H01L 33/58* (2010.01)
*H01L 33/60* (2010.01)
*H01L 33/62* (2010.01)

(52) U.S. Cl.
CPC .............. *H01L 33/58* (2013.01); *H01L 33/60* (2013.01); *H01L 2933/005* (2013.01); *H01L 2933/0058* (2013.01); *H01L 2933/0066* (2013.01)

(58) Field of Classification Search
CPC ....... H01L 2933/005; H01L 2933/0058; H01L 2933/0066; H01L 25/167; H01L 33/38
USPC .......................................................... 257/89
See application file for complete search history.

LIGHT EMITTER MOUNTING BOARD AND DISPLAY DEVICE INCLUDING LIGHT EMITTER MOUNTING BOARD

FIELD

The present invention relates to a light emitter mounting board on which light emitters such as micro-light-emitting diodes (LEDs) are mountable, and a display device including the light emitter mounting board.

BACKGROUND

A known light emitter mounting board receives light emitters such as micro-LEDs. A known self-luminous display device including the light emitter mounting board eliminates a backlight device. To improve the quality of display images on such display devices, the amount of light is to be increased, and the contrast on the display surface is to be increased.

The light emitters may each have multiple emission surfaces. When mounted on a substrate, each light emitter redirects light in a predetermined direction with a reflector. The reflector includes, for example, a planarizing layer in the substrate and a bank layer on its surface, as described in Patent Literature 1.

CITATION LIST

Patent Literature

Patent Literature 1: Japanese Unexamined Patent Application Publication (Translation of PCT Application) No. 2016-522585

BRIEF SUMMARY

A light emitter mounting board according to an aspect of the present disclosure includes an insulating substrate, an electrode layer on the insulating substrate, a resin layer on the electrode layer, a coating layer, and a reflective electrode. The insulating substrate includes an insulating material. The electrode layer includes a conductive material. The resin layer has a through-hole portion extending in a thickness direction. The coating layer covers a surface of the resin layer and covers an inner peripheral surface of the through-hole portion. The coating layer includes an in-hole portion covering the inner peripheral surface. The in-hole portion has a lateral thickness gradually increasing from the surface of the resin layer toward the electrode layer. The reflective electrode is recessed and extends at least on a surface of the in-hole portion of the coating layer and on an exposed portion of a surface of the electrode layer. The reflective electrode includes a reflective conductive material. The reflective electrode has a bottom including a mount area to receive a light emitter.

A light-emitting device according to another aspect of the present disclosure includes the light emitter mounting board, and the light emitter mounted on the mount area.

A display device according to another aspect of the present disclosure includes a plurality of reflective electrodes, the light emitter mounting board including a pixel unit including the plurality of the reflective electrodes arranged in a matrix, a micro light-emitting diode as the light emitter mounted on the mount area, and a driver that drives the micro light-emitting diode.

A method according to another aspect of the present disclosure is a method for manufacturing a light emitter mounting board. The method includes forming an electrode layer on an insulating substrate, forming a resin layer having a through-hole portion by application of a first photosensitive resin to the electrode layer and by exposure and development of the first photosensitive resin, forming a coating layer covering an inner peripheral surface of the through-hole portion by application of a second photosensitive resin to a surface of the resin layer and inside the through-hole portion and by exposure and development of the second photosensitive resin, and forming a reflective electrode being recessed and extending on a surface of the in-hole portion of the coating layer and on an exposed portion of a surface of the electrode layer. The coating layer includes an in-hole portion having a lateral thickness gradually increasing from the surface of the resin layer toward the electrode layer.

BRIEF DESCRIPTION OF DRAWINGS

The objects, features, and advantages of the present disclosure will become more apparent from the following detailed description and the drawings.

DETAILED DESCRIPTION

A light emitter mounting board, a light-emitting device, and a display device according to one or more embodiments of the present disclosure will now be described with reference to the drawings. Each figure referred to below shows main components and other elements of the light emitter mounting board, the light-emitting device, and the display device according to one or more embodiments. The light emitter mounting board, the light-emitting device, and the display device according to the embodiments may thus include known components not shown in the figures, such as circuit boards, wiring conductors, control integrated circuits (ICs), and large-scale integration (LSI) circuits.

Figure 1:
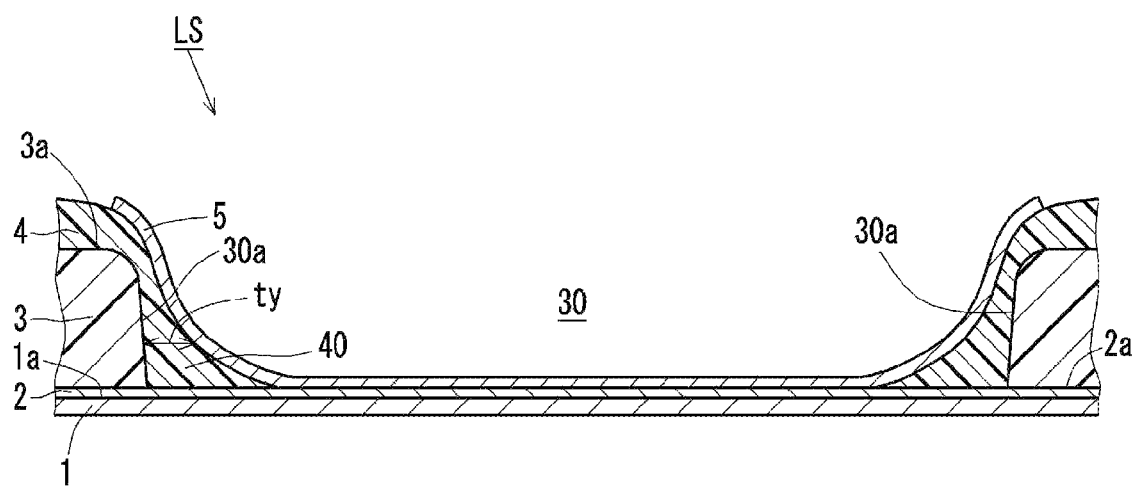
FIG. 1 is a cross-sectional view of a light emitter mounting board.

FIG. 1 is a cross-sectional view of a light emitter mounting board LS. A light-emitting device LD1 (shown in FIG. 2) includes the light emitter mounting board LS and a light emitter 6 (shown in FIG. 2) mounted on the light emitter mounting board LS. The light emitter mounting board LS includes an insulating substrate 1, an electrode layer 2, a resin layer 3, a coating layer 4, and a reflective electrode 5. The light emitter mounting board LS may include multiple insulating layers and metal layers between the insulating substrate 1 and the electrode layer 2. These metal layers electrically connect, for example, a gate electrode of a thin film transistor (TFT) to the electrode layer 2 through the insulating layers. The TFT (not shown) is located between the insulating layers described above. The TFT includes the gate electrode and a semiconductor layer including source, channel, and drain regions. The TFT includes the drain region electrically connected to an anode electrode (positive electrode) of the light emitter 6 through a conductive connector, such as a through-hole. The TFT thus functions as a switch to turn on and off the light emitter 6. The electrode layer 2 functions as a positive voltage power supply layer that supplies a positive voltage (drive voltage) to the light emitter 6 through, for example, the TFT.

The insulating substrate 1 may be formed from an insulating material. Examples of the insulating material include glass, resin, and ceramic materials. The insulating substrate 1 may be rectangular, circular, oval, trapezoidal, or in any other shape. The electrode layer 2 is located on a first surface 1a of the insulating substrate 1. The electrode layer 2 is formed from a conductive material. The electrode layer 2 may include a single metal layer, or multiple metal layers stacked on one another. Examples of the electrode layer 2 include an Al layer, Al/Ti layers (refers to a stack of a Ti layer on an Al layer; the same applies hereafter), Ti/Al/Ti layers, a Mo layer, Mo/Al/Mo layers, Mo/Al/Mo/ITO layers, a Cu layer, a Cr layer, a Ni layer, and a Ag layer.

The resin layer 3 is located on the electrode layer 2 and has a through-hole portion 30 extending in the thickness direction. The coating layer 4 covers a surface 3a of the resin layer 3 and an inner peripheral surface 30a of the through-hole portion 30. The coating layer 4 has an in-hole portion 40 covering the inner peripheral surface 30a and having a thickness ty in the lateral direction (in the direction orthogonal to the thickness direction of the resin layer 3). The thickness ty gradually increases from the surface 3a of the resin layer 3 toward the electrode layer 2. The lateral direction refers to a direction orthogonal to the thickness direction of the resin layer 3, or specifically, a direction from a measurement point on the inner peripheral surface 30a of the through-hole portion 30 toward the central axis of the through-hole portion 30 (an axis extending in a direction parallel to the thickness direction and extending through the center of the through-hole portion 30).

The resin layer 3 may have the through-hole portion 30 with a circular or polygonal opening, such as a square or rectangular opening. For a circular opening, the inner peripheral surface 30a may define a right circular cylinder, a cone, or an inverted cone. For a polygonal opening, the inner peripheral surface 30a may define a right polygonal prism, a polygonal pyramid, or an inverted polygonal pyramid. In the present embodiment, the inner peripheral surface 30a defines a right rectangular prism.

The through-hole portion 30 may have a chamfered opening edge or a round opening edge. This reduces the likelihood that the coating layer 4 is cut at the opening edge. The electrode layer 2 has a surface 2a covered with the resin layer 3. The surface 2a is partially exposed through the through-hole portion 30. The coating layer 4 covers the surface 3a of the resin layer 3 and the inner peripheral surface 30a of the through-hole portion 30. The coating layer 4 has, in the in-hole portion 40, the lateral thickness ty gradually increasing from the surface 3a of the resin layer 3 toward the electrode layer 2, or more specifically, from the opening edge of the through-hole portion 30 adjacent to the surface 3a of the resin layer 3 toward the opening edge of the through-hole portion 30 adjacent to the electrode layer 2. The coating layer 4 has, in the in-hole portion 40, the greatest lateral thickness ty at the opening edge adjacent to the electrode layer 2. The coating layer 4 partially covers the electrode layer 2 to leave a portion of the electrode layer 2 exposed, instead of entirely covering the surface 2a of the electrode layer 2 facing the through-hole portion 30. The coating layer 4 may cover at least the opening edge of the through-hole portion 30 in the surface 3a of the resin layer 3, instead of entirely covering the surface 3a of the resin layer 3.

The coating layer 4 has, in the in-hole portion 40, the lateral thickness ty gradually increasing from the surface 3a of the resin layer 3 toward the electrode layer 2 as described above. The coating layer 4 may have, in the in-hole portion 40, a sloped surface similar to, for example, an inner surface of a grinding bowl. The coating layer 4 may have, in the in-hole portion 40, for example, a curved surface such as a bowl-shaped or parabolic surface, or a surface sloped along the inner peripheral surface 30a as shown in FIG. 1.

The reflective electrode 5 extends at least on the surface of the in-hole portion 40 of the coating layer 4 and on the exposed portion of the surface 2a of the electrode layer 2. The reflective electrode 5 is formed from a reflective conductive material. The reflective electrode 5 is recessed and has, on its bottom, a mount area 5a to receive a light emitter.

A known reflector reflects light emitted from a light emitter in different directions, but cannot improve light extraction efficiency in extracting light in a predetermined direction. Additionally, a known display device cannot increase contrast.

The reflective electrode 5 covers the sloped surface of the in-hole portion 40 of the coating layer 4 with a constant thickness. The reflective electrode 5 thus conforms to the surface of the in-hole portion 40. To form the reflective electrode 5 with an intended shape and to improve the reflection efficiency, the surface of the in-hole portion 40 of the coating layer 4 may be sloped as described above.

The reflective electrode 5 is electrically connected to the electrode layer 2 and reflects light emitted from the light emitter 6 on its surface. The reflective electrode 5 is electrically connected to the light emitter 6 being mounted to electrically connect the light emitter 6 to the electrode layer 2 with the reflective electrode 5 in between.

The reflective conductive material for the reflective electrode 5 may be electrically conductive and light reflective. Examples of the reflective conductive material include a metal material having a light reflective surface colored, for example, silver. Examples of the metal material include a metal material with a single element such as aluminum (Al) or silver, and an alloy material such as an aluminum (Al)-molybdenum (Mo) alloy (indicating an alloy of Al and Mo), an aluminum (Al)-copper (Cu) alloy, an aluminum (Al)-manganese (Mn) alloy, an aluminum (Al)-silicon (Si) alloy, an aluminum (Al)-magnesium (Mg) alloy, an aluminum (Al)-zinc (Zn) alloy, an aluminum (Al)-nickel (Ni) alloy, or other aluminum alloys. The reflective electrode 5 may be formed as a metal thin film by, for example, thin film deposition such as sputtering or chemical vapor deposition (CVD), or by plating. To protect the reflective electrode 5, a transparent insulating layer of, for example, silicon oxide ($SiO_2$) may cover the reflective electrode 5. In this case, the transparent insulating layer may be located on a sloped portion of the reflective electrode 5. This also prevents the reflective electrode 5 from contacting a transparent electrode layer 8 and causing a short circuit. A transparent conductive layer of, for example, indium tin oxide (ITO) may be located on the mount area 5a (shown in FIG. 2) of the reflective electrode 5. More specifically, the light emitter 6 is mounted on the transparent conductive layer with a conductive connector such as solder or an anisotropic conductive film (ACF) in between. The light emitter 6 is electrically connected to the reflective electrode 5 with the conductive connector and the transparent conductive layer in between. The transparent conductive layer on the mount area 5a has its edge over the transparent insulating layer on the sloped portion.

When the light emitter 6 is mounted on the mount area 5a (shown in FIG. 2), the recessed reflective electrode 5 can converge light emitted from the light emitter 6 in a predetermined direction. This improves the light extraction efficiency.

In the light emitter mounting board LS, the coating layer 4 covers the surface of the resin layer 3 and the inner peripheral surface 30a of the through-hole portion 30 in the resin layer 3. The coating layer 4 has, in the in-hole portion 40 covering the inner peripheral surface 30a of the through-hole portion 30, a lateral thickness gradually increasing from the surface 3a of the resin layer 3 toward the electrode layer 2. This forms a gradually sloped surface in a bowl shape. The reflective electrode 5 on the surface of the in-hole portion 40 of the coating layer 4 and on the exposed portion of the surface of the electrode layer 2 is thus recessed in a shape similarly to, for example, a grinding bowl, a round bowl, or a parabolic surface, with the opening diameter gradually increasing from the bottom toward the opening. The reflective electrode 5 shaped in this manner improves the extraction efficiency of light emitted from the light emitter 6. More specifically, the through-hole portion 30 functions as a mold to guide formation of the coating layer 4 with an intended shape.

The reflective electrode 5 may have an extension from an opening edge of the in-hole portion 40 of the coating layer 4 to a portion of the coating layer 4 above the surface 3a of the resin layer 3. This structure facilitates reflection of the component of light that has undergone repeated total reflection (also referred to as a total reflection light component) and confined inside a transparent filling layer 7 (shown in FIG. 2) upward at the extension, thus allowing the light to be emitted outside. The extension may be located across the entire periphery of the reflective electrode 5. This structure further improves emission of the total reflection light component. The extension may have a width of 5 to 30% of the maximum width in a plan view of the reflective electrode 5 in the in-hole portion 40.

The reflective electrode 5 may cover the entire surface of the coating layer 4. This structure further improves emission of the total reflection light component. In this case, the reflective electrode 5 may have a roughened surface to scatter light. In this structure, the light scattered on the surface of the reflective electrode 5 travels in all directions. This structure thus further improves emission of the total reflection light component. The surface of the reflective electrode 5 may have an arithmetic mean roughness of 50 µm or less, or more specifically 10 µm or less. To avoid a smoother surface of the reflective electrode 5A with increased reflectance, the surface of the reflective electrode 5 may have an arithmetic mean roughness of 0.1 µm or greater.

Figure 2:
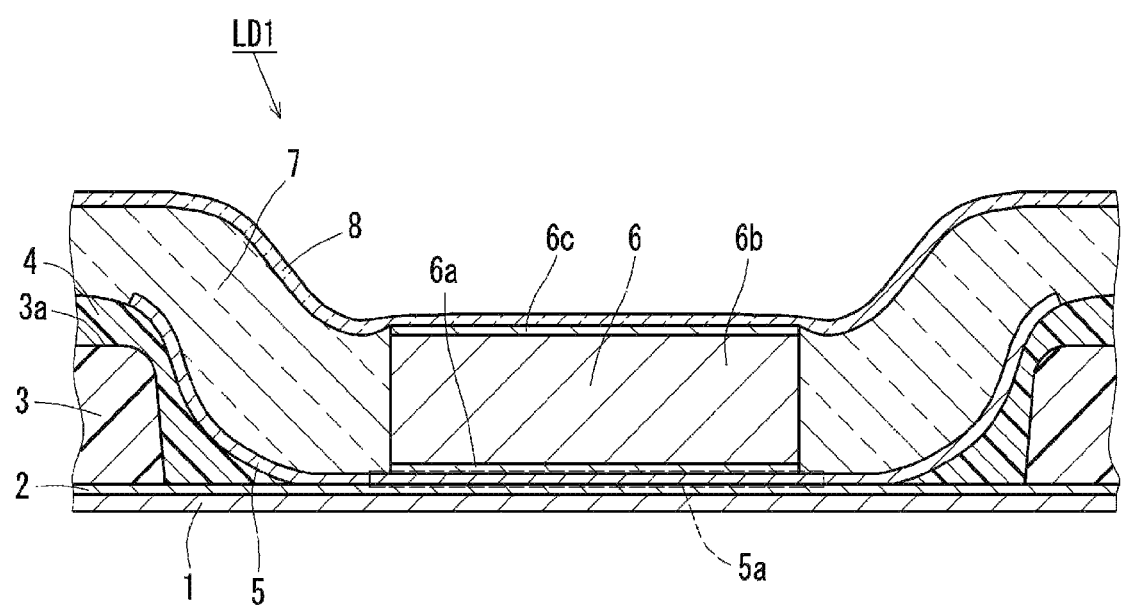
FIG. 2 is a cross-sectional view of a light-emitting device.

FIG. 2 is a cross-sectional view of the light-emitting device LD1. The light-emitting device LD1 includes the above light emitter mounting board LS and the light emitter 6 mounted on the mount area 5a of the reflective electrode 5. The light emitter 6 may be, for example, a light-emitting diode (LED), a semiconductor laser element, or another element. The light emitter 6 includes a first electrode 6a adjacent to the mount area 5a, an emissive layer 6b located on the first electrode 6a, and a second electrode 6c located on the emissive layer 6b. As described above, the first electrode 6a is electrically connected to the electrode layer 2 with the reflective electrode 5 in between. The emissive layer 6b has its side surfaces serving as emission surfaces that emit light. The first electrode 6a is a positive electrode that provides a positive potential to the emissive layer 6b, and the second electrode 6c is a negative electrode that provides a negative potential to the emissive layer 6b. The first electrode 6a may be a negative electrode. The second electrode 6c may be a positive electrode. The emissive layer 6b may have its upper and side surfaces serving as the emission surfaces that emit light. In this case, the second electrode 6c may be a transparent electrode formed from a transparent conductive material, such as ITO.

The reflective electrode 5 may include a pair of split electrodes that are insulated from each other in the mount area 5a. One split electrode may be a positive electrode, and the other may be a negative electrode. In this case, the first electrode (positive electrode) 6a and the second electrode (negative electrode) 6c are located apart from each other on the lower surface of the light emitter 6. The first electrode 6a is connected to the positive electrode of the split electrodes, and the second electrode 6c is connected to the negative electrode of the split electrodes. This structure allows light to be emitted through the upper surface of the light emitter 6. Additionally, this structure eliminates the transparent electrode layer 8, which is otherwise to be connected to the second electrode 6c on the upper surface of the light emitter 6.

The light-emitting device LD1 further includes the transparent filling layer 7 and the transparent electrode layer 8. The transparent filling layer 7 fills a recess surrounded by the reflective electrode 5. The transparent electrode layer 8 is located on the surface of the transparent filling layer 7 and is electrically connected to the second electrode 6c. The transparent filling layer 7 fills the recess in which the light emitter 6 is mounted on the reflective electrode 5 to encapsulate and protect the light emitter 6. The second electrode 6c in the light emitter 6 is not covered with the transparent filling layer 7 and is connectable to the transparent electrode layer 8. In addition to filling the recess, the transparent filling layer 7 may also cover the coating layer 4, which covers the surface 3a of the resin layer 3. The transparent filling layer 7 may cover the surface 3a of the resin layer 3 in a portion in which the surface 3a of the resin layer 3 is exposed.

Examples of the material used for the transparent filling layer 7 include a transparent resin such as an acrylic resin or a polycarbonate resin.

The emissive layer 6b in the light emitter 6 is formed from a material having a high refractive index, such as InGaN (refractive index of 2.59) or AlGaP (refractive index of 3.49). The emissive layer 6b may thus satisfy $n1>n2>n3$, where n1 is the refractive index of the emissive layer 6b, n2 is the refractive index of the transparent filling layer 7 as a peripheral medium of the emissive layer 6b, and n3 (=1) is the refractive index of air. In this structure, the critical angle of total reflection of light can be increased at the interface between the emissive layer 6b and the transparent filling layer 7. This improves the light extraction efficiency. When the refractive index of the transparent filling layer 7 is 1.8 or greater, the critical angle can be 30° or greater. When the refractive index of the transparent filling layer 7 is 2.0 or greater, the critical angle can be 35° or greater. When the refractive index of the transparent filling layer 7 is 2.3 or greater, the critical angle can be 40° or greater.

The transparent electrode layer 8 is located on the surface of the transparent filling layer 7 and also covers the second electrode 6c in the light emitter 6 to allow electrical connection between them. The electrode layer 2 and the transparent electrode layer 8 are connected to a circuit such as a driver (described later) to allow application of a drive current to the light emitter 6. The light emitter 6 thus emits light. Examples of the material used for the transparent electrode layer 8 include a conductive and transparent material such as ITO, indium zinc oxide (IZO), silicon oxide-doped indium tin oxide (ITSO), zinc oxide (ZnO), and Si containing phosphorus and boron. The transparent filling layer 7 and the transparent electrode layer 8 may be at least transparent to light with a wavelength emitted from the light emitter 6.

The light emitted through the side surfaces (emission surface) of the emissive layer 6b in the light emitter 6 travels through the transparent filling layer 7, is reflected from the reflective electrode 5, is transmitted through the transparent electrode layer 8, and is emitted outside. The recessed reflective electrode 5 reduces light confined in the transparent filling layer 7 and redirects the light reflected from the reflective electrode 5 in a predetermined direction (upward). This improves the light extraction efficiency.

The light-emitting device LD1 may receive one or more light emitters 6. Multiple light emitters 6 to be mounted may emit light with the same color or different colors. For the light emitters capable of emitting different colors, the light-emitting device LD1 can emit light of various colors by mixing these colors. For example, the light-emitting device LD1 may include a red-light emissive light emitter 6, a green-light emissive light emitter 6, and a blue-light emissive light emitter 6. A display device may include multiple pixel units each including a red-light emissive light emitter 6, a green-light emissive light emitter 6, and a blue-light emissive light emitter 6. These light emitters 6 are arranged in a matrix.

FIGS. 3 to 6 are cross-sectional views of light-emitting devices LD2 to LD5 according to other embodiments. The light-emitting device LD2 shown in FIG. 3 further includes a planarizing resin layer 9, in addition to the components of the light-emitting device LD1 shown in FIG. 2. In the light-emitting device LD1 shown in FIG. 2, the transparent electrode layer 8 is connected to the second electrode 6c in the light emitter 6, causing a dent in a central portion. The planarizing resin layer 9 fills this dent and covers the entire surface of the transparent electrode layer 8 to protect the transparent electrode layer 8 and planarize the surface of the light emitting device LD2. The planarized surface of the light emitting device LD2 allows placement of other components, such as optical components including a focusing lens and a focusing lens array.

Examples of the material used for the planarizing resin layer 9, which is also transparent, include a transparent resin such as an acrylic resin or a polycarbonate resin. The transparent filling layer 7 and the planarizing resin layer 9 may be formed from the same resin material or different resin materials.

The emissive layer 6b may satisfy n1>n2>n2a>n3, where n1 is the refractive index of the emissive layer 6b, n2 is the refractive index of the transparent filling layer 7 as a peripheral medium of the emissive layer 6b, n2a is the refractive index of the planarizing resin layer 9 as a peripheral medium of the transparent filling layer 7, and n3 (=1) is the refractive index of air. In this structure, the critical angle of total reflection of light can be increased at the interface between the emissive layer 6b and the transparent filling layer 7. The critical angle of total reflection of light can also be increased at the interface between the transparent filling layer 7 and the planarizing resin layer 9. This improves the light extraction efficiency.

Figure 4:
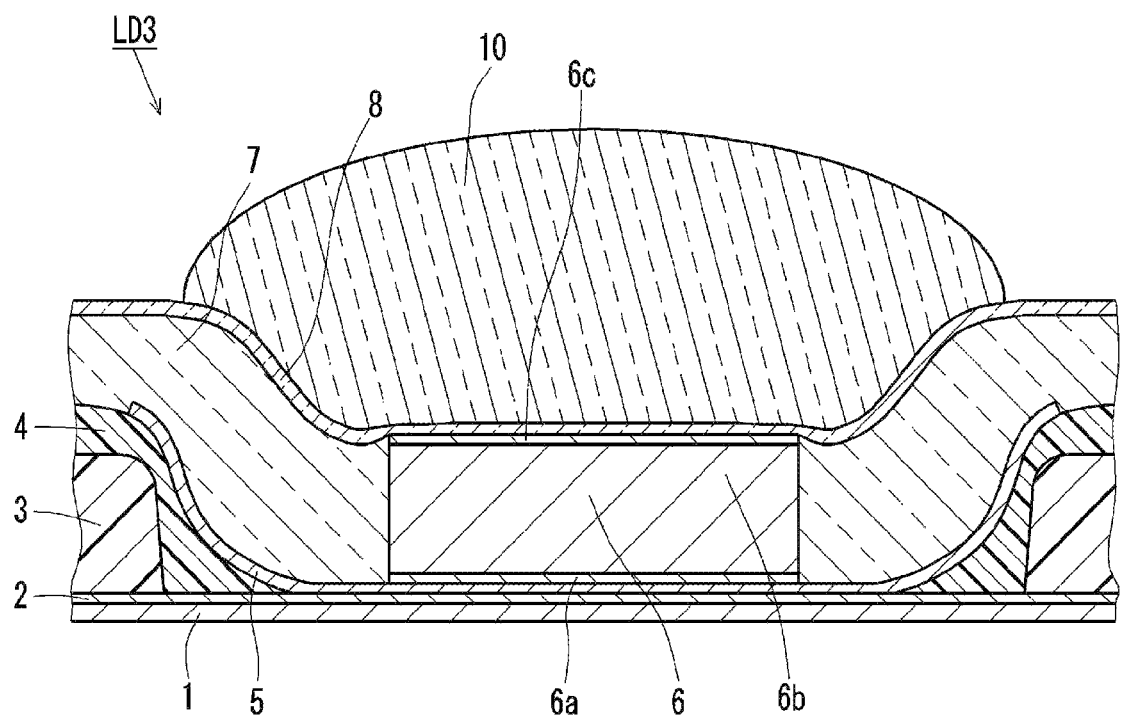
FIG. 4 is a cross-sectional view of a light-emitting device according to another embodiment.

The light-emitting device LD3 shown in FIG. 4 further includes a lenticular resin layer 10, in addition to the components of the light-emitting device LD1 shown in FIG. 2. The lenticular resin layer 10 fills a recess above the light emitter 6 and is in the shape of a convex lens. The lenticular resin layer 10 focuses the emitted light and forms converging light rays at the focal point.

Examples of the material used for the lenticular resin layer 10, which is also transparent, include a transparent resin such as an acrylic resin or a polycarbonate resin. The transparent filling layer 7 and the lenticular resin layer 10 may be formed from the same resin material or different resin materials.

Figure 3:
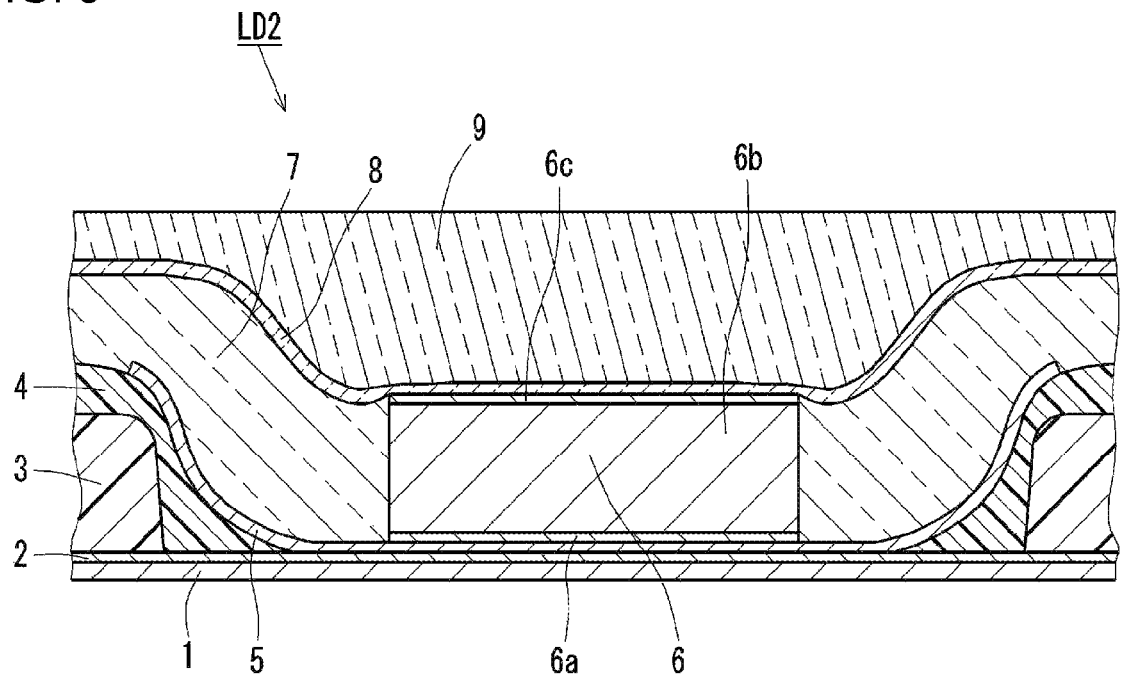
FIG. 3 is a cross-sectional view of a light-emitting device according to another embodiment.
Figure 5:
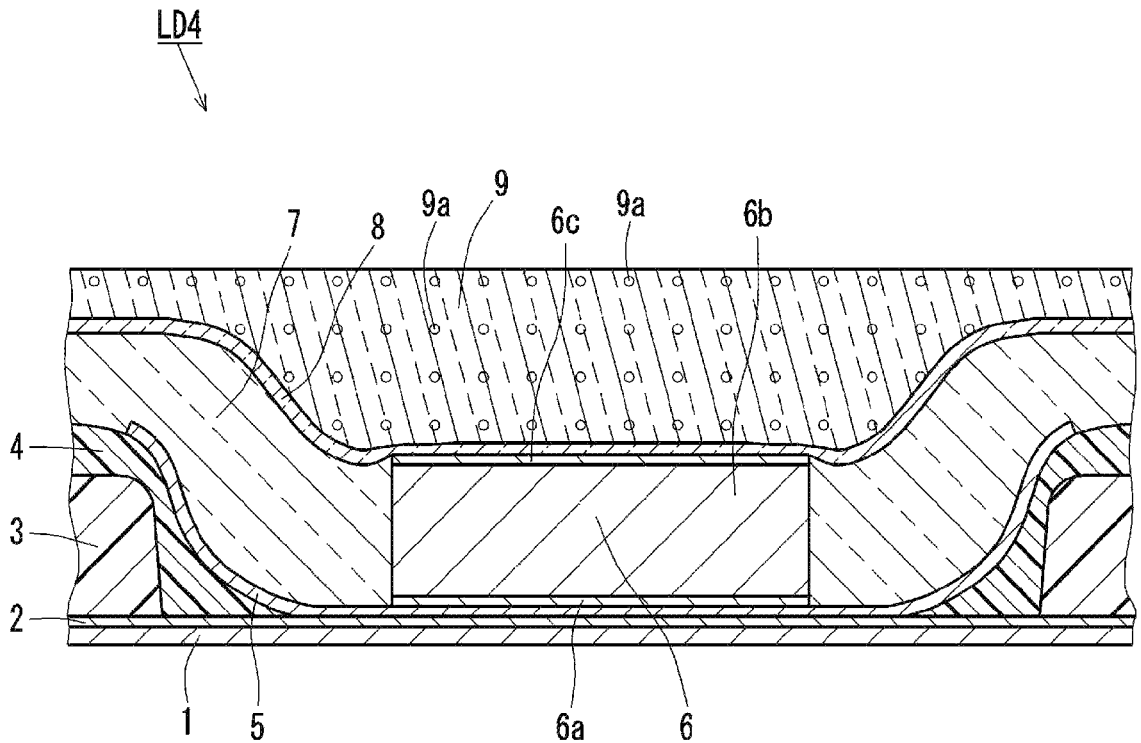
FIG. 5 is a cross-sectional view of a light-emitting device according to another embodiment.

The light-emitting device LD4 shown in FIG. 5 further includes light-scattering particles 9a dispersed in the planarizing resin layer 9 in the light-emitting device LD2 shown in FIG. 3. The light-scattering particles 9a scatter the light traveling through the planarizing resin layer 9. The scattered light is then emitted outside. Examples of the material used for the light-scattering particles 9a include a material less likely to absorb or is unlikely to absorb light emitted from the light emitter 6, a transparent material having a different refractive index from the planarizing resin layer 9, or an opaque material having a light-reflecting or light-scattering surface. Examples of the transparent material used for the light-scattering particles 9a include silicon oxide (silica or $SiO_2$), titanium oxide ($TiO_2$), glass, or a resin. Examples of the opaque material used for the light-scattering particles 9a include metal such as aluminum or silver, an alloy such as stainless steel, or a ceramic material such as alumina ($Al_2O_3$).

Scattered light is mainly emitted outside, reducing uneven luminance. The light-scattering particles 9a may be dispersed, for example, to cause the planarizing resin layer 9 containing the dispersed light-scattering particles 9a to have a haze value of about 5 to 90%.

Figure 6:
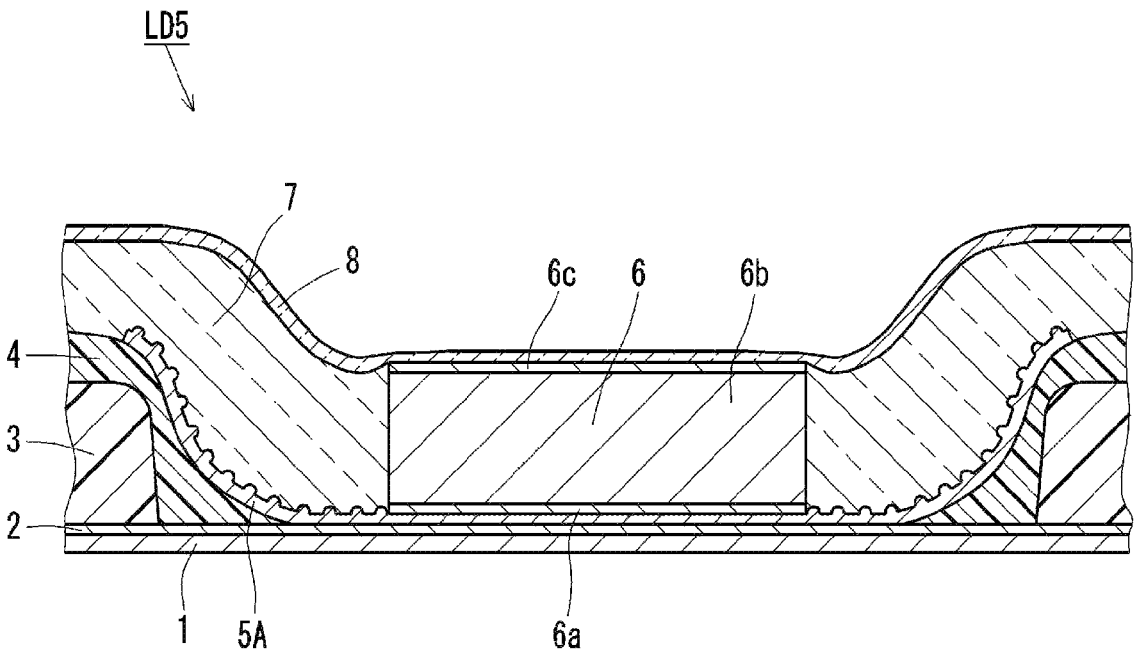
FIG. 6 is a cross-sectional view of a light-emitting device according to another embodiment.

The light-emitting device LD5 shown in FIG. 6 is the same as the light-emitting device LD1 shown in FIG. 2, except that the surface of a reflective electrode 5A is roughened. The surface of the reflective electrode 5A may have an arithmetic mean roughness of 50 μm or less, or more specifically 10 μm or less. To avoid a smoother surface of the reflective electrode 5A with increased reflectance, the surface of the reflective electrode 5A may have an arithmetic mean roughness of 0.1 μm or greater.

The surface of the reflective electrode 5A may be roughened by, for example, etching or dry etching, or controlling the film deposition duration and temperature in forming the reflective electrode 5 with thin film deposition, such as chemical vapor deposition (CVD). The reflective electrode 5A may be formed using grain structures such as giant single crystal grains and giant polycrystal grains. In some embodiments, the surface of the in-hole portion 40 of the coating layer 4 is roughened, and the reflective electrode 5A is then formed on the roughened surface. The reflective electrode 5A conforms to the uneven surface of the in-hole portion 40. The resultant surface of the reflective electrode 5A is thus uneven. This achieves a surface similar to a roughened surface.

Figure 7A:
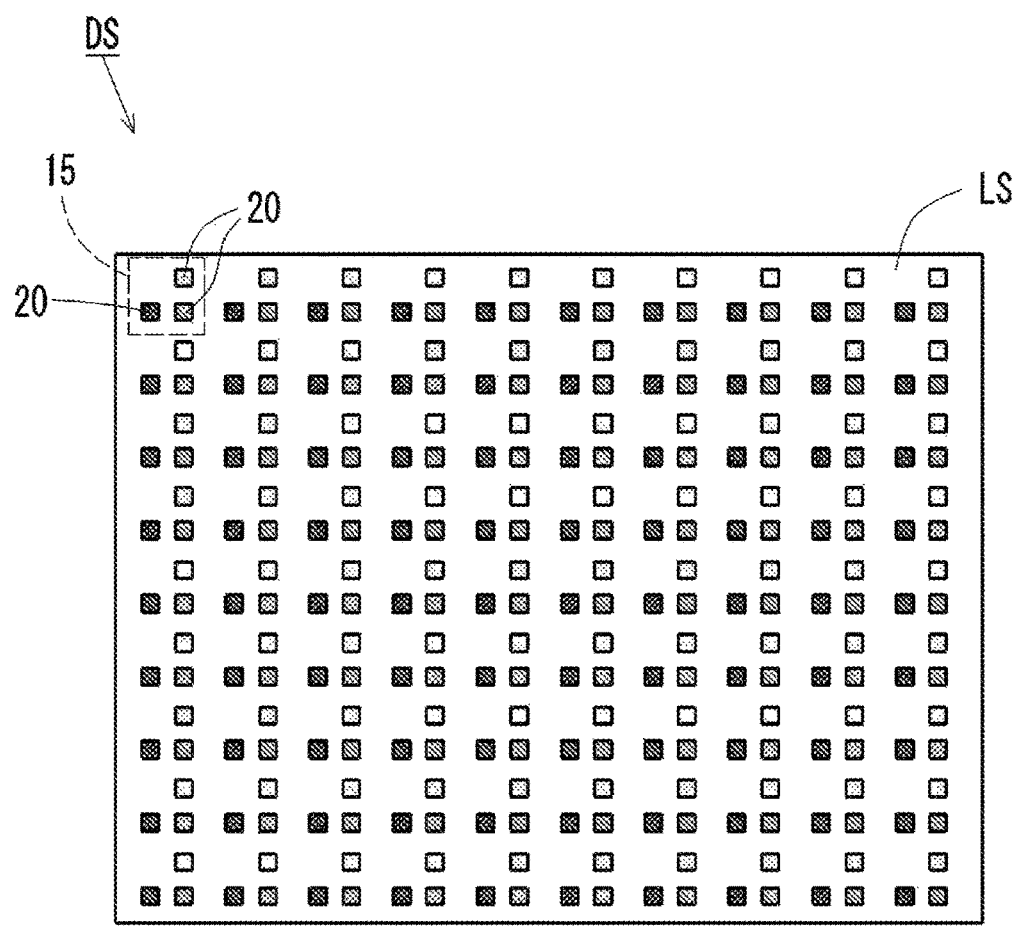
FIG. 7A is a plan view of a display device.
Figure 7B:
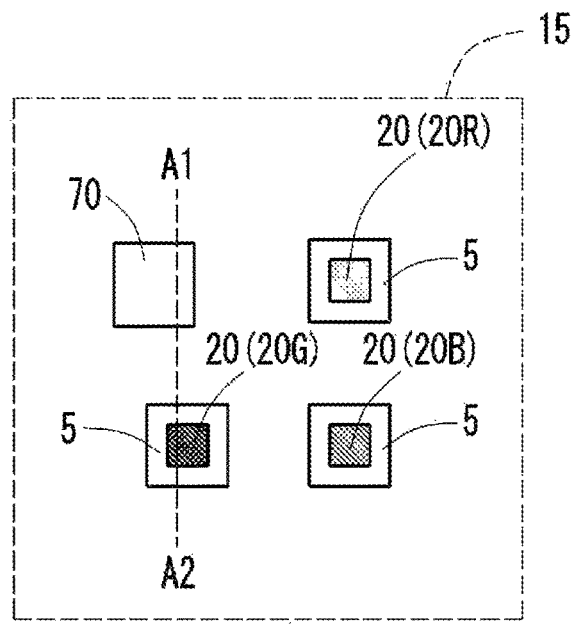
FIG. 7B is an enlarged plan view of a pixel unit.
Figure 8:
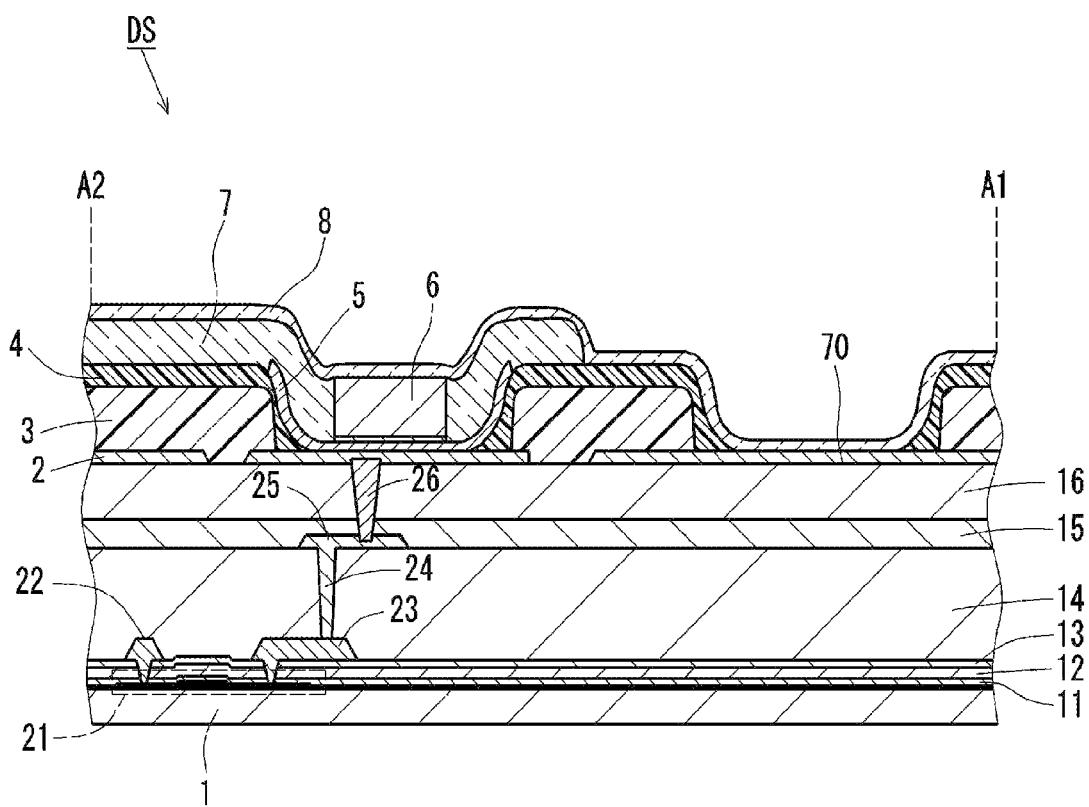
FIG. 8 is a cross-sectional view of the display device.
Figure 9:
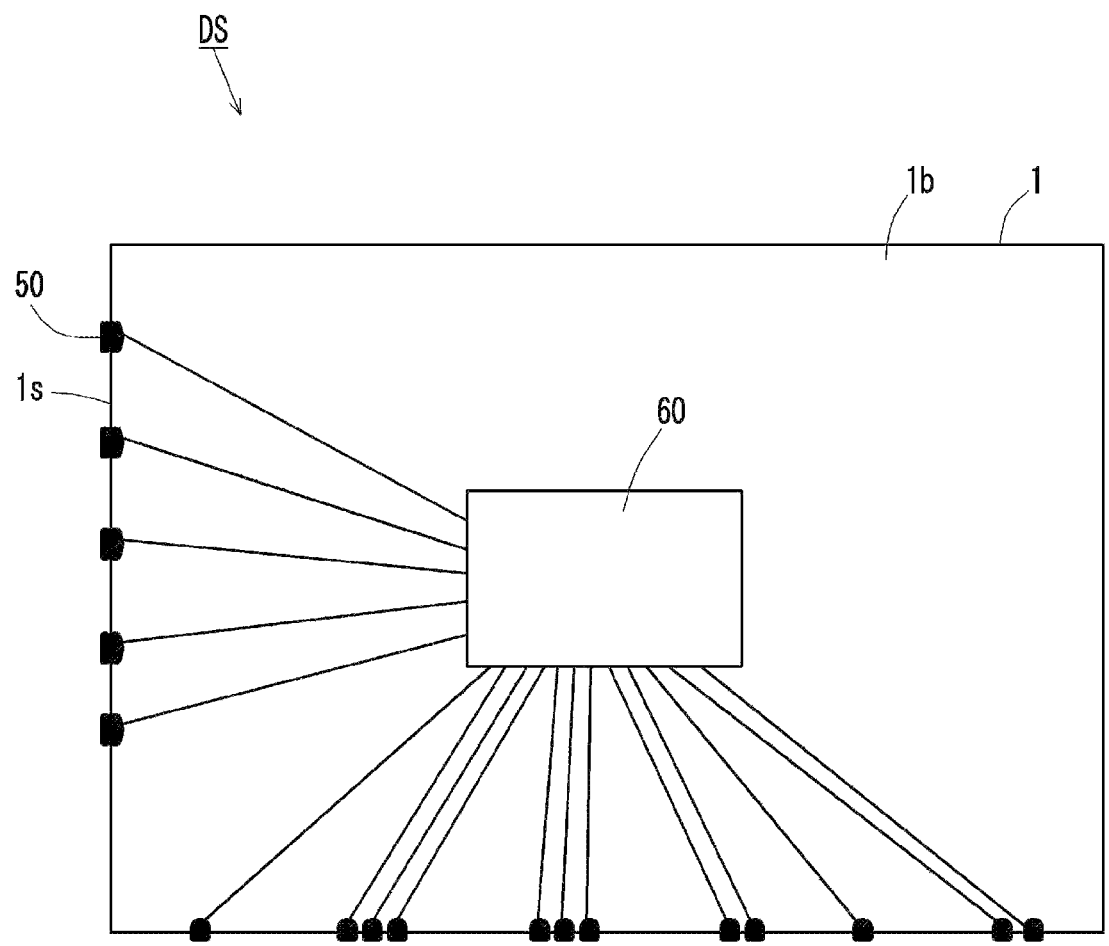
FIG. 9 is a rear view of the display device.

The display device will now be described. FIG. 7A is a plan view of a display device DS. FIG. 7B is an enlarged plan view of a pixel unit 15. FIG. 8 is a cross-sectional view of the display device DS taken along line A1-A2 in FIG. 7B. FIG. 9 is a rear view of the display device DS. The display device DS includes the light emitter mounting board LS including the pixel units 15 including the reflective electrodes 5 arranged in a matrix, micro-LEDs 20 as the light emitters 6 mounted on the mount areas 5a, and a driver 60 that drives the micro-LEDs 20. The display device DS includes the reflective electrodes 5 arranged in a matrix and the micro-LEDs 20 mounted on the mount area 5a of each reflective electrode 5.

In the present embodiment, a single pixel unit 15 includes three micro-LEDs 20. The three micro-LEDs 20 include a red-light emissive micro-LED 20R, a green-light emissive micro-LED 20G, and a blue-light emissive micro-LED 20B. Each of the micro-LEDs 20R, 20G, and 20B is rectangular as viewed in plan, and may have, but is not limited to, a size of about 1 to 100 μm inclusive on each side, or more specifically, about 3 to 10 μm inclusive on each side.

In some embodiments, the micro-LED 20R may emit orange, red-orange, red-violet, or violet light, instead of red light. The micro-LED 20G may emit yellow-green light, instead of green light. A single pixel unit 15 including three or more micro-LEDs may have two or more micro-LEDs having the same emission color. A single pixel unit 15 may include six micro-LEDs 20 in total. More specifically, a single pixel unit 15 may include one set of micro-LEDs 20R, 20G, and 20B and another set of micro-LEDs 20R, 20G, and 20B. In this case, one set may be activated primarily, and the other may be prepared redundantly. In some embodiments, one set that is activated primarily and the other that is prepared redundantly may be switchable using, for example, a switch.

The pixel unit 15, including the micro-LEDs 20R, 20G, and 20B with different emission colors, functions as a basic element of display. For example, a color display device includes pixel units 15 each including a red-light emissive micro-LED 20R, a green-light emissive micro-LED 20G, and a blue-light emissive micro-LED 20B to enable display of color tones.

In some embodiments, the micro-LEDs 20R, 20G, and 20B are not aligned on a single straight line as viewed in plan. In this case, the pixel unit 15 is smaller as viewed in plan, and may be compact and square as viewed in plan. The display device or other devices thus include pixels with higher density and less irregularities, thus enabling high-quality image display.

The display device DS according to the present embodiment may include the transparent electrode layer 8 located on the pixel units 15. The transparent electrode layer 8 conducts the negative potential from a power electrode pad 70 commonly to each of the second electrodes 6c in the micro-LEDs 20R, 20G, and 20B. The transparent electrode layer 8 may extend across multiple pixel units 15 or all the pixel units 15. The transparent electrode layer 8 facilitates emission of light from the micro-LEDs 20R, 20G, and 20B.

In the display device DS, the resin layer 3 may function as a black matrix. The resin layer 3 may be light-shielding and dark colored, such as in black, blackish brown, or dark blue. The dark colored resin layer 3 allows the display device DS to show dark color or, for example, black on its background, thus increasing the contrast and the display quality of the display device DS. The resin layer 3 may be dark colored by, for example, mixing dark-colored ceramic particles or plastic particles, dark-colored pigments, or dark-colored dyes into the resin layer 3.

The display device DS includes, as shown in FIG. 8, insulating layers 11 to 16 sequentially stacked on the insulating substrate 1 in this order. The insulating layers 11 to 16 are formed from, for example, $SiO_2$ or silicon nitride ($Si_3N_4$). A TFT 21 is located between the insulating substrate 1 and the insulating layer 11. The TFT 21 includes a semiconductor layer including a source region connected to a source electrode 22 and a drain region connected to a drain electrode 23. The drain electrode 23 is connected to the electrode layer 2 through a through-hole 24, interlayer wiring 25, and a through-hole 26.

The insulating substrate 1 has a second surface 1b opposite to the first surface 1a, and side surfaces 1s. The insulating substrate 1 includes side wiring 50 on the side surfaces 1s and the driver 60 on the second surface 1b. The micro-LEDs 20R, 20G, and 20B are connected to the driver 60 with the side wiring 50. The display device DS according to the present embodiment may include multiple insulating substrates 1 each receiving multiple micro-LEDs 20. The insulating substrates 1 may be arranged in a grid on the same plane. The insulating substrates 1 may be connected (tiled) together with their side surfaces bonded with, for example, an adhesive. The display device DS can thus be composite and large, forming a multi-display.

The driver 60 include a TFT serving as a switch or a control element for controlling the emission or non-emission state and the light intensity of the micro-LEDs 20R, 20G, and 20B in each pixel unit 15. The driver 60 may include driving elements such as ICs and LSI circuits mounted on the insulating substrate 1 by chip on glass or may be a circuit board on which driving elements are mounted. The driver 60 may also be a thin film circuit including, for example, a TFT that includes a semiconductor layer including low temperature polycrystalline silicon (LTPS) formed directly on the second surface 1b of the insulating substrate 1, which may be a glass substrate, by thin film deposition such as CVD.

The side wiring 50 may be formed from a conductive paste including conductive particles such as silver (Ag), copper (Cu), aluminum (Al), or stainless steel, an uncured resin component, an alcohol solvent, and water. The conductive paste may be cured by heating, photocuring using UV ray irradiation, or a combination of photocuring and heating. The side wiring 50 may also be formed by plating or thin film deposition, such as vapor deposition or CVD. The insulating substrate 1 may have grooves on the side surfaces 1s to receive the side wiring 50. This allows the conductive paste to be easily received in the grooves or in an intended portion on the side surfaces 1s.

The method for manufacturing a light emitter mounting board will now be described. An electrode layer 2 is first formed on an insulating substrate 1, and a first photosensitive resin is applied to the electrode layer 2. The first photosensitive resin is exposed to light and developed to form a resin layer 3 with a through-hole portion 30. The first photosensitive resin may be, for example, either negative or positive. In the present embodiment, a negative photosensitive resin is used. The resin layer 3 with the through-hole portion 30 is formed using the negative photosensitive resin through exposure and curing of the negative photosensitive resin excluding a portion corresponding to the through-hole portion 30. The through-hole portion 30 is covered with, for example, a mask. Light exposure causes a negative photosensitive resin to be less easily dissolved with a developer. The exposed portion thus remains after the development. In other words, the exposed portion cures and remains after the development. Light exposure causes a positive photosensitive resin to be more easily dissolved with a developer. The exposed portion is thus removed. In other words, the exposed portion is softened and removed after the development.

Examples of the photosensitive resin include an epoxy resin, polysiloxanes, and a polyamide-imide-based resin, such as photosensitive polyimides and polyoxazoles. An example of the negative photosensitive resin contains an epoxy resin having two or more epoxy groups in one molecule, an alkali-soluble resin, and a photocation polymerization initiator. An example of the positive photosensitive resin contains a hydroxy group-containing polyamide and a naphthoquinone-diazide derivative serving as a photosensitive agent. An example of the developer is tetramethylammonium hydroxide (TMAH).

A second photosensitive resin is applied to a surface 3a of the resulting resin layer 3 and inside the through-hole portion 30 to cover an inner peripheral surface 30a of the through-hole portion 30 through exposure and development. The second photosensitive resin forms a coating layer 4 having, in an in-hole portion 40, a lateral thickness gradually increasing from the surface 3a toward the electrode layer 2. The second photosensitive resin may be, for example, a positive photosensitive resin. Appropriate adjustment of light exposure to the second photosensitive resin in the through-hole portion 30 allows the in-hole portion 40 to have a varying thickness inside the through-hole portion 30 described above. The light exposure is adjusted to be about $0.3L1 \leq L2 \leq 0.7L1$, where L1 is an amount of light exposure for complete penetration of the second photosensitive resin inside the through-hole portion 30, L2 is an amount of light exposure less than L1. The minimum exposure range covers a portion of the second photosensitive resin inside the through-hole portion 30, for example, a central portion of the second photosensitive resin inside the through-hole portion 30 (about 0.5S, where S is the area of the entire second photosensitive resin inside the through-hole portion 30 in a plan view). The maximum exposure range covers the entire second photosensitive resin inside the through-hole portion 30 and its surrounding area (about 1.5S). The exposure range may be set to an intended optimum range in accordance with, for example, the depth and the opening size of the through-hole portion 30 or the amount of exposure.

Examples of a light source and the type of light used for exposure include a semiconductor laser (e.g., with a wavelength of 830 nm, 532 nm, 488 nm, or 405 nm), a metal halide lamp, a high-pressure mercury lamp (a g-line with a wavelength of 436 nm, an h-line with a wavelength of 405 nm, an i-line with a wavelength of 365 nm, and a broad wavelength range with three wavelengths of g-line, h-line, and i-line), an excimer laser (a KrF excimer laser with a wavelength of 248 nm, an ArF excimer laser with a wavelength of 193 nm, and an F2 excimer laser with a wavelength of 157 nm), and extreme ultraviolet (EUV with a wavelength of 13.6 nm). The optimum light source and light can be selected from the above light sources and the types of light.

Incomplete adjustment of light exposure to the second photosensitive resin in the through-hole portion 30 causes the softened second photosensitive resin, which is to be the coating layer 4, to be viscous. Such viscosity allows the softened second photosensitive resin to have a meniscus (a curve in the liquid surface of the softened second photosensitive resin resulting from interaction with the inner peripheral surface 30a of the through-hole portion 30) along the inner peripheral surface 30a of the through-hole portion 30. The resulting surface is gradually sloped as described above.

A reflective electrode 5 is formed to cover the surface of the in-hole portion 40 of the coating layer 4 and an exposed portion of a surface of the electrode layer 2. The reflective electrode 5 can be formed by, as described above, sputtering or other methods. The light emitter mounting board LS manufactured in this manner includes the recessed reflective electrode 5.

The light-emitting device DS according to the present embodiment can be used as, for example, a printer head for an image formation device and other devices, an illumination device, a signboard, and a notice board. The light emitter mounting board LS according to the present embodiment and the display device DS including the light emitter mounting board LS are not limited to the above embodiments and may include design alterations and improvements as appropriate.

The present disclosure may be embodied in various forms without departing from the spirit or the main features of the present disclosure. The embodiments described above are thus merely illustrative in all respects. The scope of the present disclosure is defined not by the description given above but by the claims. Any modifications and alterations contained in the claims fall within the scope of the present invention.

REFERENCE SIGNS LIST 1 insulating substrate
1a first surface
1b second surface
1s side surface
2 electrode layer
2a surface
3 resin layer
3a surface
4 coating layer
5 reflective electrode
5a mount area
6 light emitter
6a first electrode
6b emissive layer
6c second electrode
6cR second electrode
7 transparent filling layer
8 transparent electrode layer
9 planarizing resin layer
9a light-scattering particle
10 lenticular resin layer
15 pixel unit
20 micro-LED
20B micro-LED
20Gmicro-LED
20Rmicro-LED
30 through-hole portion
30a inner peripheral surface
40 in-hole portion
50 side wiring
60 driver

The invention claimed is:
1. A light emitter mounting board, comprising:
an insulating substrate comprising an insulating material;
an electrode layer on the insulating substrate, the electrode layer comprising a conductive material;

a resin layer on the electrode layer, the resin layer having a through-hole portion extending in a thickness direction;

a coating layer covering a surface of the resin layer opposite to the electrode layer and covering an inner peripheral surface of the through-hole portion, the coating layer including an in-hole portion covering the inner peripheral surface, the in-hole portion having a lateral thickness gradually increasing from the surface of the resin layer opposite to the electrode layer toward the electrode layer; and a reflective electrode being recessed and extending at least on a surface of the in-hole portion of the coating layer and on an exposed portion of a surface of the electrode layer, the reflective electrode comprising a reflective conductive material, the reflective electrode having a bottom including a mount area to receive a light emitter.

2. The light emitter mounting board according to claim 1, wherein
the resin layer comprises a negative photosensitive resin, and the coating layer comprises a positive photosensitive resin.

3. The light emitter mounting board according to claim 1, wherein
the reflective electrode includes a pair of split electrodes insulated from each other in the mount area.

4. A light-emitting device, comprising:
the light emitter mounting board according to claim 1; and
the light emitter mounted on the mount area.

5. A display device, comprising:
the light emitter mounting board according to claim 1, wherein the reflective electrode is a plurality of reflective electrodes, the light emitter mounting board including a pixel unit, the pixel unit including the plurality of the reflective electrodes arranged in a matrix;
a micro light-emitting diode as the light emitter mounted on the mount area; and
a driver configured to drive the micro light-emitting diode.

6. The display device according to claim 5, wherein
the resin layer is light-shielding.

7. A method for manufacturing a light emitter mounting board, the method comprising:
forming an electrode layer on an insulating substrate;
forming a resin layer having a through-hole portion by application of a first photosensitive resin to the electrode layer and by exposure and development of the first photosensitive resin;
forming a coating layer covering an inner peripheral surface of the through-hole portion by application of a second photosensitive resin to a surface of the resin layer and inside the through-hole portion and by exposure and development of the second photosensitive resin, the coating layer including an in-hole portion having a lateral thickness gradually increasing from the surface of the resin layer toward the electrode layer; and
forming a reflective electrode being recessed and extending on a surface of the in-hole portion of the coating layer and on an exposed portion of a surface of the electrode layer.

8. The method according to claim 7, wherein
the first photosensitive resin includes a negative photosensitive resin, and
the second photosensitive resin includes a positive photosensitive resin.

* * * * *